(12) United States Patent
McGrath et al.

(10) Patent No.: US 7,973,836 B2
(45) Date of Patent: Jul. 5, 2011

(54) CAMERA, IMAGE SENSOR, AND METHOD FOR DECREASING UNDESIRABLE DARK CURRENT

(75) Inventors: R. Daniel McGrath, Pittsford, NY (US); Edward T. Nelson, Pittsford, NY (US); Robert M. Guidash, Rochester, NY (US); Charles V. Stancampiano, Rochester, NY (US); James P. Lavine, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 974 days.

(21) Appl. No.: 10/975,865

(22) Filed: Oct. 28, 2004

(65) Prior Publication Data
US 2006/0092296 A1     May 4, 2006

(51) Int. Cl.
H04N 9/64      (2006.01)
H01L 31/102    (2006.01)
(52) U.S. Cl. .................................. 348/243; 257/463
(58) Field of Classification Search .................. 348/243, 348/241, 304, 308, 294, 248, 249, 250, 251, 348/255, 297, 299, 311, 296; 257/291; 250/208.1
See application file for complete search history.

(56) References Cited

U.S. PATENT DOCUMENTS

| | | | | |
|---|---|---|---|---|
| 5,623,306 A | * | 4/1997 | Kajihara et al. | 348/243 |
| 5,965,910 A | * | 10/1999 | Wood | 257/231 |
| 6,690,423 B1 | * | 2/2004 | Nakamura et al. | 348/311 |
| 6,730,899 B1 | | 5/2004 | Stevens et al. | |
| 6,876,019 B2 | * | 4/2005 | Shinohara | 257/292 |
| 7,259,790 B2 | * | 8/2007 | Mabuchi et al. | 348/310 |
| 2002/0109160 A1 | * | 8/2002 | Mabuchi et al. | 257/233 |
| 2004/0173799 A1 | * | 9/2004 | Patrick | 257/72 |

FOREIGN PATENT DOCUMENTS

| EP | 1 223 623 A2 | | 7/2002 |
|---|---|---|---|
| EP | 1223623 A2 | * | 7/2002 |

* cited by examiner

Primary Examiner — Lin Ye
Assistant Examiner — Ahmed Berhan
(74) Attorney, Agent, or Firm — Blakely Sokoloff Taylor & Zafman LLP

(57) ABSTRACT

A method for lowering dark current in an image sensor pixel, the method includes the steps of providing a photosensitive area for receiving incident light which is converted into a charge; providing a gate for transferring charge from the photosensitive area; wherein the gate is held at a voltage which will accumulate majority carriers at a semiconductor-dielectric interface during integration for the photosensitive area. Alternatively, a potential profile can be provided under the gate to drain the dark current away from the photogeneration diffusion.

7 Claims, 8 Drawing Sheets

CAMERA, IMAGE SENSOR, AND METHOD FOR DECREASING UNDESIRABLE DARK CURRENT

FIELD OF THE INVENTION

The invention relates generally to the field of image sensors and, more particularly, to such image sensors in which undesirable dark current is substantially eliminated.

BACKGROUND OF THE INVENTION

As is well known in the art, dark current is a significant limitation of the performance of image sensors, particularly CMOS image sensors. A typical image sensor includes a substrate having a photosensitive area or charge collection area for collecting charge, and a transfer gate for transferring charge from the photosensitive area to either a charge-to-voltage conversion mechanism, such as a floating diffusion in a CMOS image sensor, a transfer mechanism in a charge-coupled device image sensor or to a reset mechanism. A dielectric is positioned between the gate and the substrate, and the area of contact between the two areas is generally referred to in the art as the semiconductor/dielectric interface. During certain stages of image capture, such as integration, electrons not associated with the photosensitive process that captures the electronic representation of the image, i.e., the photo-generation process, accumulate in certain portions of the sensor, such as adjacent gates, and inherently migrate into the photosensitive area. These electrons, a portion of what is called dark current, are undesirable as they degrade the quality of the captured image.

It is known that a pinned photodiode includes substantially all the above-described devices except as described hereinbelow. In this regard, pinned photodiodes include a photosensitive area with a pinned layer spanning the photosensitive area. Pinned photodiodes are known to decrease dark current in photosensitive areas. However, dark current still exists from adjacent gates.

Consequently, a need exists for substantially eliminating dark current associated with adjacent gates and other similar structures.

SUMMARY OF THE INVENTION

The present invention is directed to overcoming one or more of the problems set forth above. Briefly summarized, according to one aspect of the present invention, the invention resides in a method for lowering dark current in an image sensor pixel, the method comprising the steps of providing a photosensitive area for receiving incident light which is converted into a charge; providing a gate for transferring charge from the photosensitive area; wherein the gate is held at a voltage which will accumulate majority carriers at a semiconductor-dielectric interface during integration for the photosensitive area.

An alternative means to overcoming one or more of the problems set forth above is presented where the potential profile under the adjoining gate is created so that dark current related to the gate is drained away from the photogeneration diffusion.

These and other aspects, objects, features and advantages of the present invention will be more clearly understood and appreciated from a review of the following detailed description of the preferred embodiments and appended claims, and by reference to the accompanying drawings.

Advantgeous Effects Of The Invention

The present invention has the advantage of substantially eliminating dark current adjacent gates and the like.

DETAILED DESCRIPTION OF THE INVENTION

Figure 1:
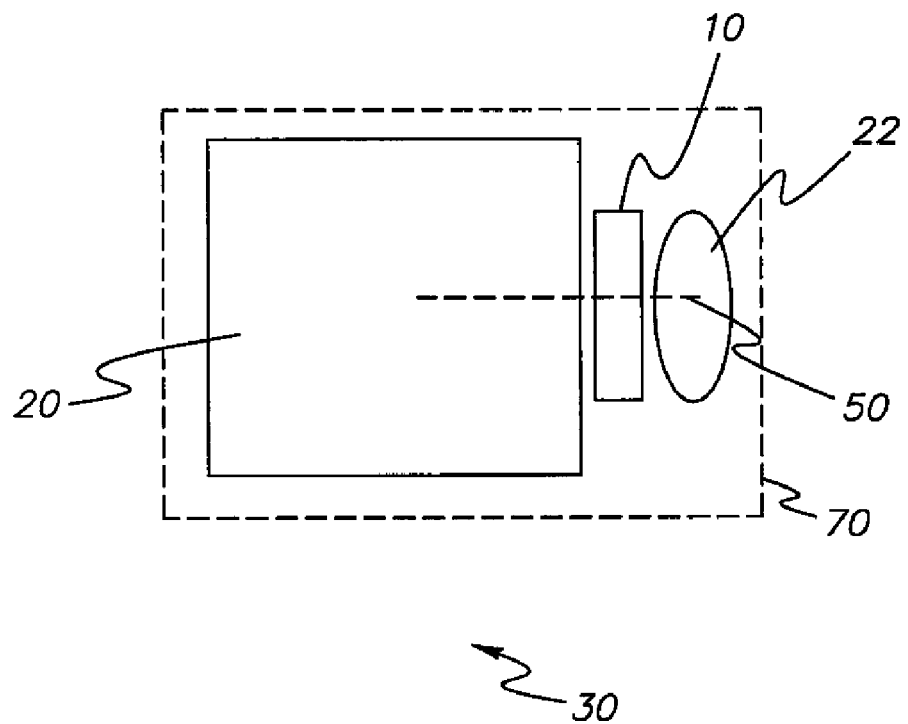
FIG. 1 is a top view of a typical art image sensor pixel.
Figure 2:
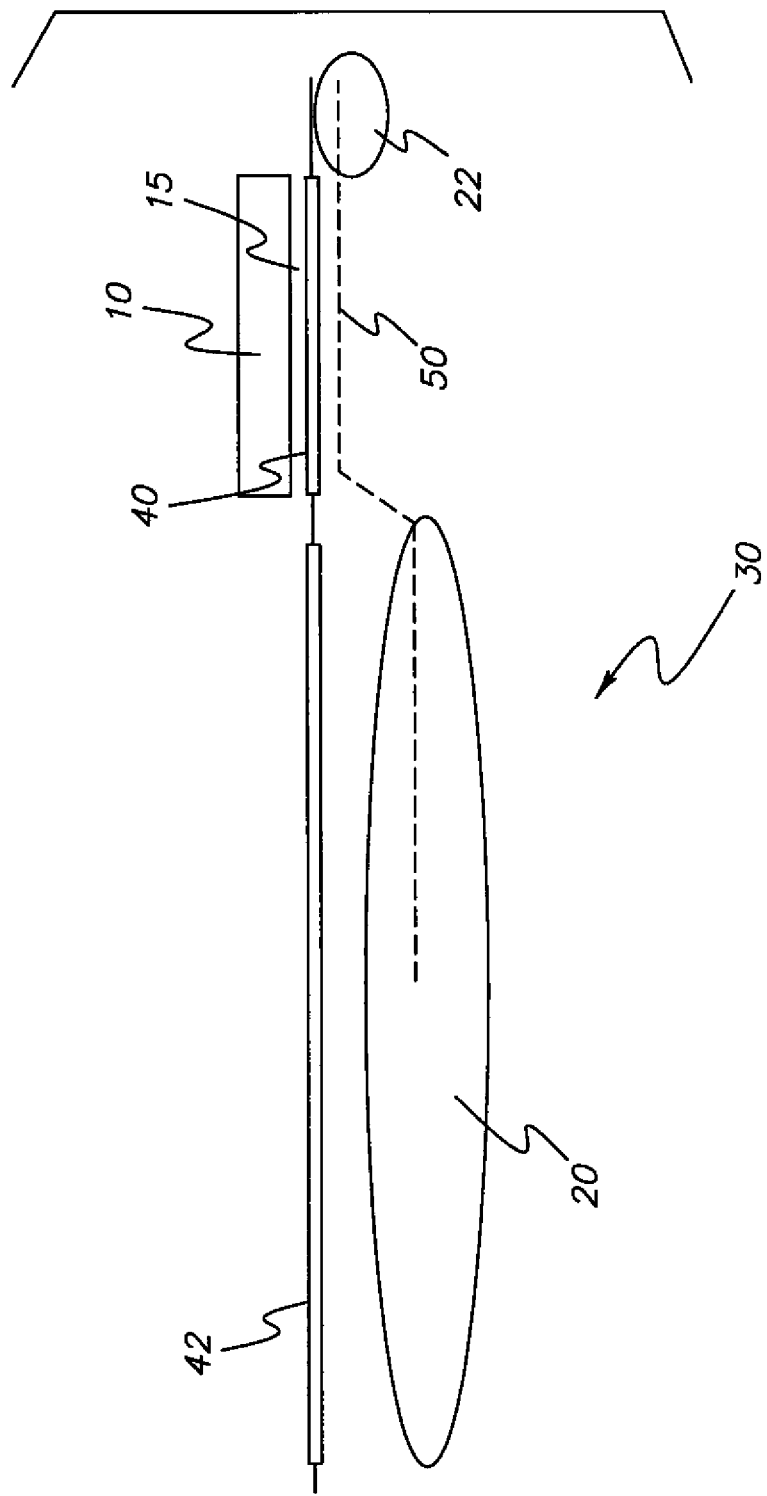
FIG. 2 is a side view in cross section of FIG. 1.

Referring to FIGS. 1 and 2, there is shown the top and side view of a pixel of an image sensor of the present invention. Although only one pixel 70 is shown, as is well known in the art, a plurality of such pixels exists on an image sensor and only one is shown for clarity of understanding. The image sensor includes a substrate 30, preferably silicon, having a photosensitive area or charge collection area 20 therein; the photogeneration takes place in the charge collection area 20. The photosensitive area 20 receives incident light and consequently converts the incident light into charge packets during image integration, as is well known in the art. The photosenstive area 20 is electrically isolated from other areas of the pixel and other associated circuitry. A gate 10 having a dielectric 15 spanning its lower portion provides a portion of this isolation, and the gate 10 can be electrically biased to isolate the photosensitive area 20 or to permit the charge collected in the photosensitive area 20 to flow into an adjoining charge-to-voltage conversion node 22 (or referred to alternatively as diffusion or charge sensing node) for purposes of measurement of charge or resetting the charge collection area 20. The gate-controlled charge transfer is along a path 50 that is formed by creating a trough of potential minimum.

Undesirable dark current is generated both in the photosensitive area 20 and along the charge transfer channel 50. Typically, a high rate of dark current generation occurs both at the semiconductor/dielectric interface 42 adjacent to the photosensitive area 20 and at the semiconductor/dielectric interface 40 under the gate 10 due to the high rate of generation resulting from interface states. The dark current from the interfaces 40 and 42 is the dominant source of dark current flowing into the charge sensing node 22. It is noted that the charge sensing node 22 may be replaced by a reset node resulting in the same behavior. For purposes of brevity in the present invention, the implementation with the charge sensing node 22 will be discussed.

Figure 3:
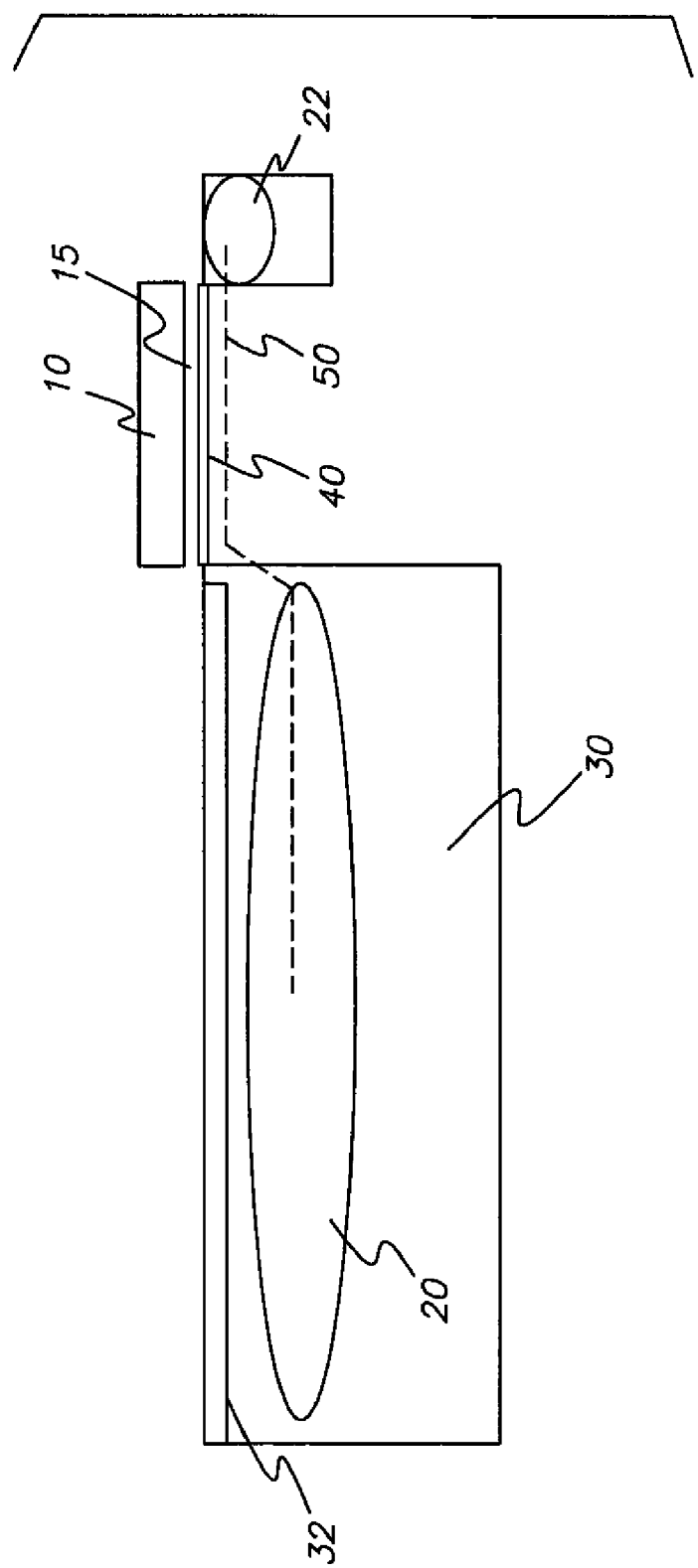
FIG. 3 is a side view in cross section of the image sensor pixel of FIG. 1 with a pinned-photodiode.

Referring to FIG. 3, there is shown the side view of a pixel where a heavily doped diffusion 32 opposite in type to that in the charge collection area 20 is used to shield the charge collection area 20 from the interface 42. This is generally referred to in the art as a pinned photodiode pixel. The photogeneration and charge transfer is along path 50 as before. The diffusion 32, among other benefits, has the effect to suppress dark current generation at the semiconductor/dielectric interface 42 adjacent to the charge collection area 20.

In this configuration, a dominant source of dark current is at the semiconductor/dielectric interface or surface 40 under the gate 10. The present invention presents a means of surpressing this dark current by biasing the gate 10 to a potential so that the semiconductor at the interface 40 becomes accumulated with free carriers of the majority doping type. The dark current generation occurs because the defects are in an non-equilibrium state, and this accumulation supresses this generation by returning the region where the highest quantity of defects occur to local equilibrium.

Figure 4:
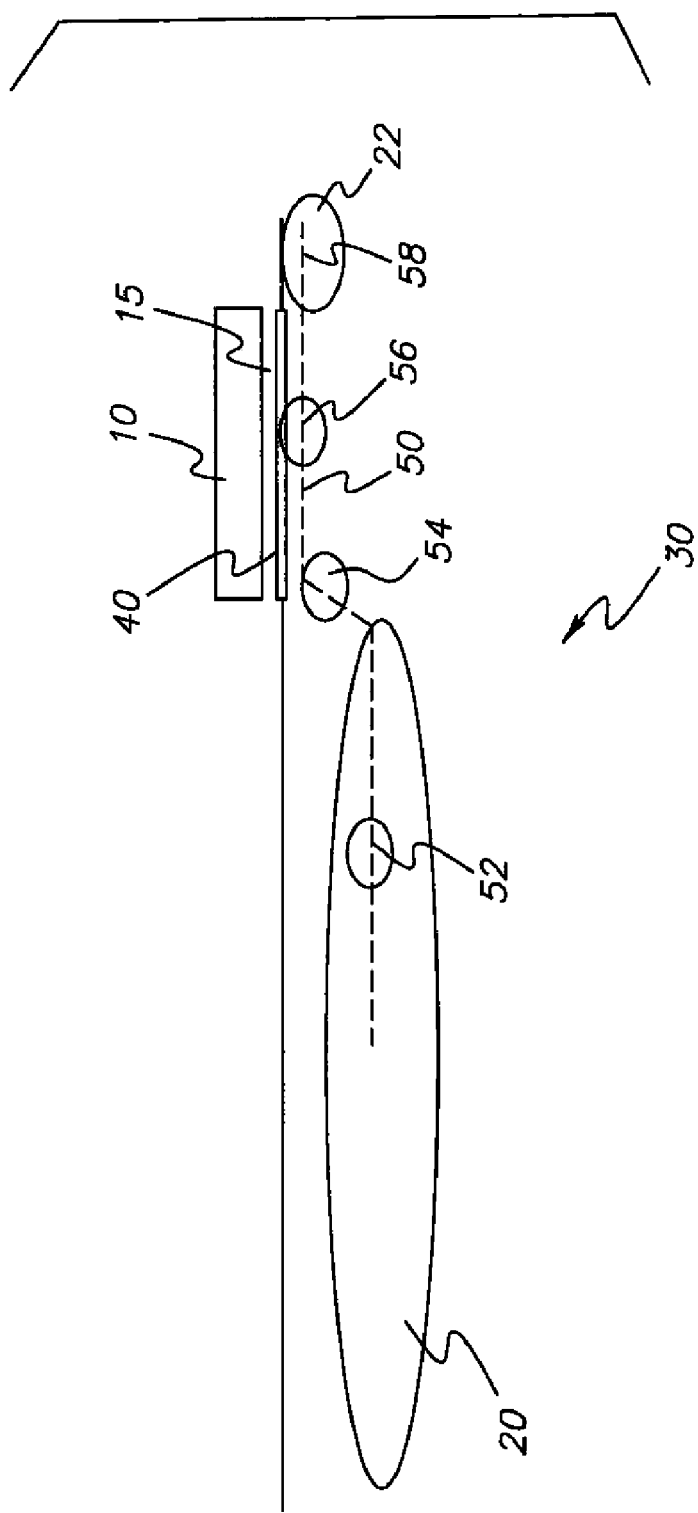
FIG. 4 is a side view in cross section of an image sensor pixel showing the charge transfer channel from the photogeneration diffusion.

Referring to FIG. 4, there is shown a side view in cross section of the image sensor of the present invention as in FIG. 2. In the prior art, the interface 40 is biased in a non-equilibrium state resulting in the generation of dark current. The charge generated by photogeneration (desirable charge generated by the incident light for capturing the image) and by dark current (undesirable charge generated by other means well known in the art) is collected within the charge collection area 20 at a potential extremum 52. This signal charge is isolated during integration by a barrier created either at the charge-to-transfer potential transition 54 located between the potential extremum 52 and the gate-associated charge transfer channel 56, or at the gate-associated charge transfer channel 56. The existence of either of these barriers is a result of the doping in the semiconductor 30 and the bias on the gate 10.

Figure 5A:
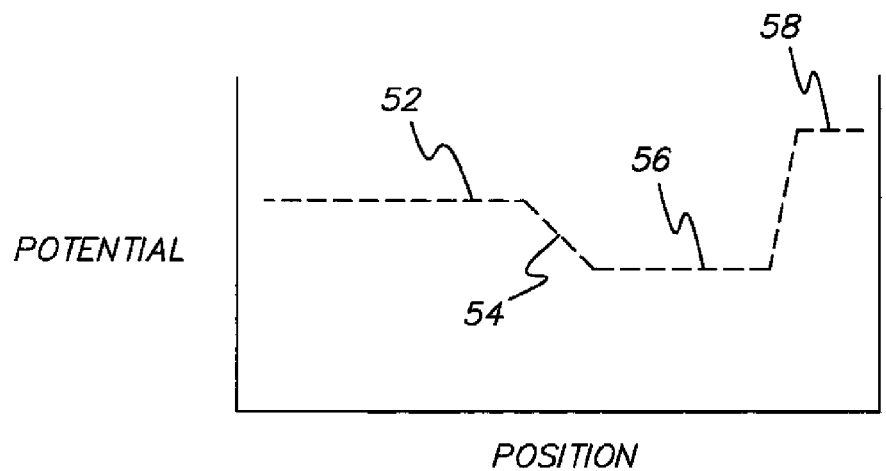
FIG. 5A is a potential profile along the charge transfer channel during signal integration in the photogeneration in the prior art.

Referring to FIG. 5A, there is in the prior art the potential in the gate-associated channel or gate channel potential 56 where the potential on gate forms a barrier that isolates the collection potential 52 from the destination potential 58 and where dark current charge can flow both through the collection-to-transfer potential transition 54 to add to dark current in the collection potential 52 that adds to the signal charge, and along the charge transfer path 50 to the destination potential 58. The result is that some of the dark current generated in the interface under the gate 40 will contribute to the dark current in the signal charge located at the destination potential 58.

Figure 5B:
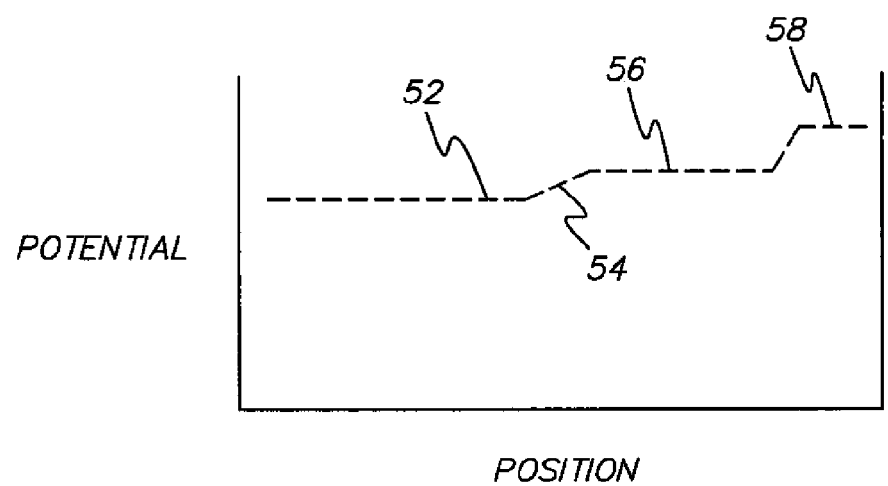
FIG. 5B is a potential profile along the charge transfer channel during charge transfer from the photogeneration in the present invention.

Referring to FIG. 5B, there is shown that the potential profile of the present invention where the potential on gate 10 removes a barrier that isolated the collection potential 52 from the destination potential 58 and whereby signal charge is readout or reset from the charge collection area 20 along the path 50 to the destination potential 58. Before this is accomplished and while the barrier is still present, however, the charge in the destination potential 58 is removed by means commonly known in the art so that any dark current collected here is kept separate from signal charge.

Figure 5C:
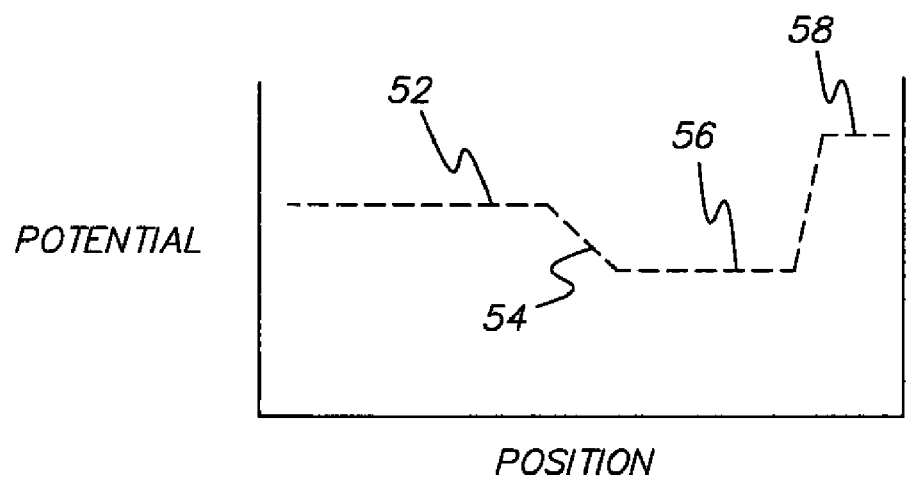
FIG. 5C is a potential profile along the charge transfer channel during signal integration in the photogeneration with negative voltage.

Referring to FIG. 5C, in a manner in the present invention, a mechanism is disclosed where the gate 10 is used to adjust the potential in the gate-associated channel 56, for example by applying a negative voltage, to the point where the potential on gate 10 forms a barrier that isolates the collection potential 52 from the destination potential 58 and whereby the semiconductor interface 40 is held in an equilibrium condition. The equilibrium condition suppresses dark current from this interface 40 so that it does not contribute to signal dark current collected in the collection volume 52 and does not eventually be transferred along the channel to the destination potential 58.

Figure 5D:
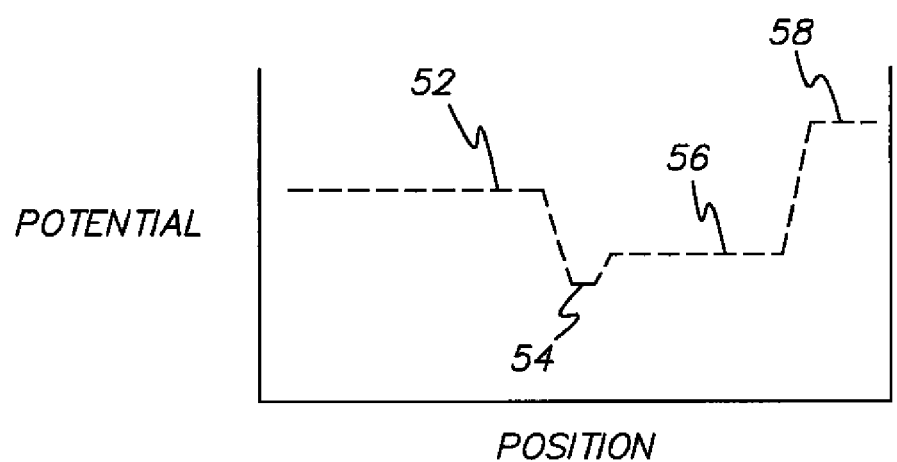
FIG. 5D is a potential profile along the charge transfer channel during signal integration in the photogeneration in the present invention.

In the present invention, an additional mechanism, in addition to the above described biasing, is disclosed to eliminate the contribution of dark current from the interface under the gate 10 and the charge transfer channel under the gate 56. Referring to FIG. 5D, there is shown that this dark charge can be directed toward the destination potential 58 if a potential barrier to charge flow is formed at the collection-to-transfer potential transition 54. The dark charge will flow to destination potential 58 where it can be removed before the gate bias is changed to transfer the signal charge (for example the image signal) along the potential path 50 to the destination potential 58 or is otherwise read out. Therefore, this dark current is kept separate from the signal charge collected at the destination potential 58. Such a barrier can be created as a result of the doping in the semiconductor 30 and the bias on the gate 10.

Figure 5E:
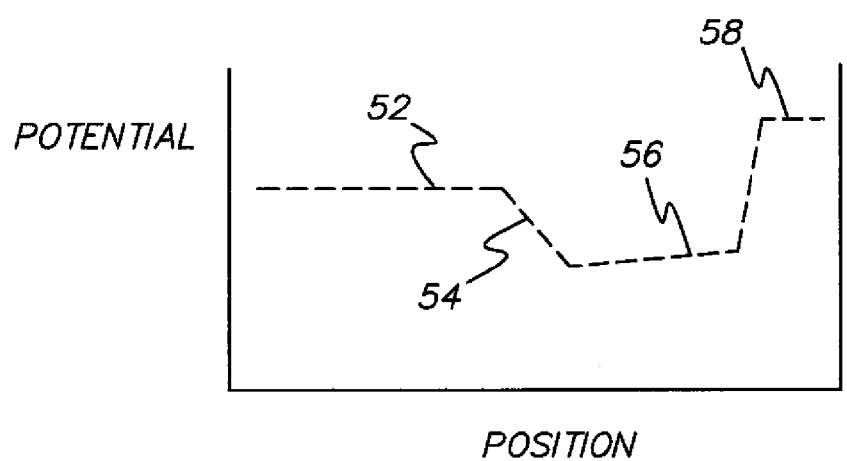
FIG. 5E is a potential profile along the charge transfer channel during signal integration in the photogeneration in an alternate embodiment of the present invention.

Referring to FIG. 5E, as an additional embodiment of the present invention, the same result can be achieved if a potential gradient is formed along the transfer channel potential 56 causing the dark current charge generated at the interface under the gate 10 to preferentially flow to the destination potential 58 during the signal integration. Therefore, this dark current is kept separate from the signal charge or image signal collected at the destination potential 58. Such a barrier can be created as a result of the doping in the semiconductor 30 the bias on the gate 10 and the bias on the destination potential 58.

Figure 6:
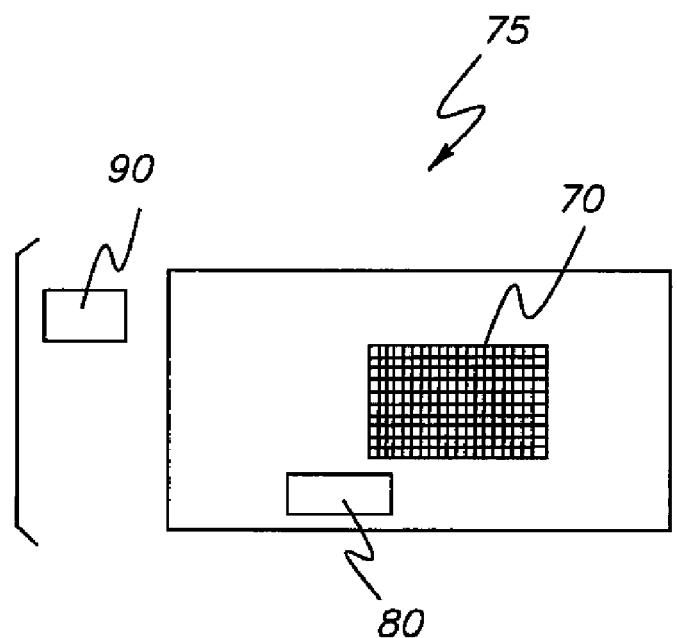
FIG. 6 is a top view of the image sensor including some on-chip and off-chip circuitry.

Referring to FIG. 6, there is shown a top view of an image sensor 75 having a plurality of pixels 70 and additional, on-chip circuitry or generation source 80 which includes circuitry that enables operation of the above-described, more specifically biasing of the gates 10. Alternatively, this circuitry may be implemented by off-chip or external circuitry 90.

Figure 7:
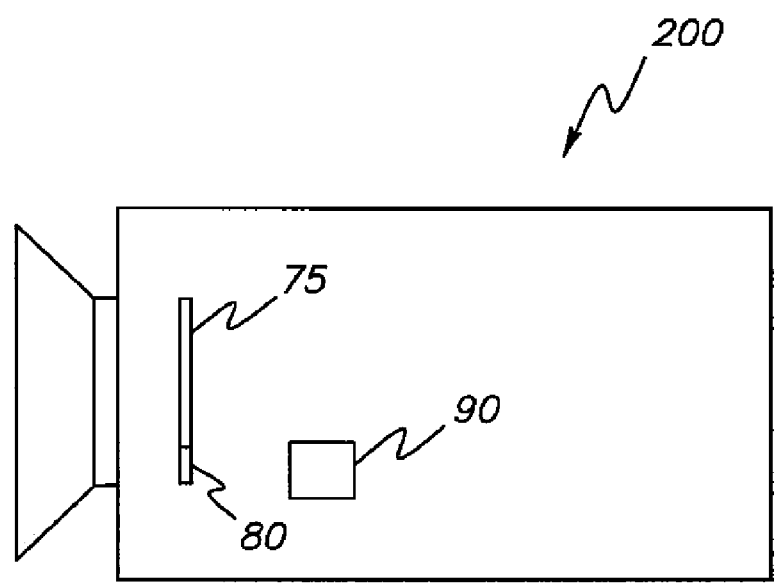
FIG. 7 is a camera for illustrating a typical commercial embodiment for the image sensor of the present invention.

Referring to FIG. 7, there is shown a camera 200 that includes the image sensor 75 of the present invention for illustrating a typical commercial embodiment.

The invention has been described with reference to preferred embodiments. However, it will be appreciated that variations and modifications can be effected by a person of ordinary skill in the art without departing from the scope of the invention.

PARTS LIST 10 gate
15 dielectric
20 photosensitive or charge collection area
22 charge-to-voltage conversion node (or referred to alternatively as diffusion or charge sensing node)
30 substrate/semiconductor
32 heavily doped diffusion
40 semiconductor/dielectric interface
42 semiconductor/dielectric interface
50 path or gate controlled charge transfer channel
52 potential extremium or collection potential
54 charge-to-transfer potential transition or collection-to-transfer potential transition
56 gate-associated charge transfer channel or gate channel potential
58 destination potential
70 pixels 75 image sensor
80 on-chip circuitry or generation source
90 off-chip or external circuitry
200 camera

The invention claimed is:

1. A method for lowering dark current in an image sensor pixel, the method comprising:
 (a) providing a substrate;
 (b) providing a photosensitive area in the substrate for receiving incident light that is converted into a charge;
 (c) providing a gate for transferring charge from the photosensitive area; and
 (d) during integration of the photosensitive area and before charge transfer, transferring dark current generated at a surface of the substrate under the entire gate away from the photosensitive area and into a diffusion disposed on an opposite side of the gate from the photosensitive area by providing a potential gradient in a charge-to-transfer potential transition region in a charge transfer channel disposed at the surface of the substrate under the gate.

2. The method of claim 1, further comprising biasing the gate during integration of the photosensitive area.

3. An image sensor pixel comprising:
 (a) a substrate;
 (b) a photosensitive area in the substrate for receiving incident light that is converted into a charge; and
 (c) a gate for transferring charge from the photosensitive area;
 (d) a potential gradient created by a doping gradient, wherein the potential gradient is in a charge-to-transfer potential transition region in a charge transfer channel disposed at a surface of the substrate under the gate that during integration of the photosensitive area transfers dark current generated at the entire surface under the gate away from the photosensitive area and into a diffusion area disposed on an opposite side of the gate from the photosensitive area.

4. An image capture device, comprising:
 an image sensor including a plurality of pixels with at least one pixel comprising:
 (a) a substrate;
 (b) a photosensitive area in the substrate for receiving incident light that is converted into a charge;
 (c) a gate for transferring charge from the photosensitive area; and
 (d) a potential gradient created by a doping gradient, wherein the potential gradient is in a charge-to-transfer potential transition region in a charge transfer channel disposed at a surface of the substrate under the gate that during integration of the photosensitive area transfers dark current generated at the entire surface under the gate away from the photosensitive area and into a diffusion area disposed on an opposite side of the gate from the photosensitive area.

5. An image sensor pixel comprising:
 (a) a substrate;
 (b) a photosensitive area in the substrate for receiving incident light that is converted into a charge; and
 (c) a gate for transferring charge from the photosensitive area;
 (d) a potential barrier in a charge-to-transfer potential transition region disposed at a surface of the substrate at a proximal edge of the gate that during integration of the photosensitive area transfers dark current generated at the surface under the gate away from the photosensitive area and into a diffusion area disposed on an opposite side of the gate from the photosensitive area.

6. An image capture device, comprising:
 an image sensor including a plurality of pixels with at least one pixel comprising:
 (a) a substrate;
 (b) a photosensitive area in the substrate for receiving incident light that is converted into a charge; and
 (c) a gate for transferring charge from the photosensitive area;
 (d) a potential barrier in a charge-to-transfer potential transition region disposed at a surface of the substrate at a proximal edge of the gate that during integration of the photosensitive area transfers dark current generated at the surface under the gate away from the photosensitive area and into a diffusion area disposed on an opposite side of the gate from the photosensitive area.

7. A method for lowering dark current in an image sensor pixel, the method comprising:
 (a) providing a substrate;
 (b) providing a photosensitive area in the substrate for receiving incident light that is converted into a charge;
 (c) providing a gate for transferring charge from the photosensitive area; and
 (d) providing a potential barrier in a charge-to-transfer potential transition region disposed at a surface of the substrate at a proximal edge of the gate that during integration of the photosensitive area transfers dark current generated at the surface under the gate away from the photosensitive area and into a diffusion area disposed on an opposite side of the gate from the photosensitive area.

* * * * *